(12) United States Patent
Pagaila et al.

(10) Patent No.: US 9,443,828 B2
(45) Date of Patent: *Sep. 13, 2016

(54) SEMICONDUCTOR DEVICE AND METHOD OF EMBEDDING THERMALLY CONDUCTIVE LAYER IN INTERCONNECT STRUCTURE FOR HEAT DISSIPATION

(71) Applicant: STATS ChipPAC, Ltd., Singapore (SG)

(72) Inventors: Reza A. Pagaila, Tangerang (ID); Byung Tai Do, Singapore (SG); Linda Pei Ee Chua, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 14/694,811

(22) Filed: Apr. 23, 2015

(65) Prior Publication Data
US 2015/0228628 A1 Aug. 13, 2015

Related U.S. Application Data

(60) Division of application No. 14/017,963, filed on Sep. 4, 2013, now Pat. No. 9,048,211, which is a continuation of application No. 13/492,668, filed on Jun. 8, 2012, now Pat. No. 8,575,769, which is a division of application No. 12/507,130, filed on Jul. 22, 2009, now Pat. No. 8,237,252.

(51) Int. Cl.
H01L 25/065 (2006.01)
H01L 21/56 (2006.01)
(Continued)

(52) U.S. Cl.
CPC .......... H01L 25/0657 (2013.01); H01L 21/56 (2013.01); H01L 21/561 (2013.01);
(Continued)

(58) Field of Classification Search
CPC . H01L 21/561; H01L 21/565; H01L 21/568; H01L 23/3128; H01L 23/36; H01L 23/3677; H01L 23/49827; H01L 23/5389; H01L 25/0657; H01L 21/56; H01L 23/3114; H01L 24/19; H01L 24/97; H01L 23/481; H01L 23/04; H01L 2924/1204; H01L 2224/04105; H01L 2224/20; H01L 2225/06517; H01L 2225/06524; H01L 2225/06589; H01L 2924/01004; H01L 2924/01013; H01L 2924/01029; H01L 2924/0103; H01L 2924/01073; H01L 2924/01074
See application file for complete search history.

(56) References Cited

U.S. PATENT DOCUMENTS 5,155,068 A 10/1992 Tada
5,250,843 A 10/1993 Eichelberger
(Continued)

Primary Examiner — Roy Potter
(74) Attorney, Agent, or Firm — Robert D. Atkins; Patent Law Group: Atkins and Associates, P.C.

(57) ABSTRACT

A semiconductor device has a first thermally conductive layer formed over a first surface of a semiconductor die. A second surface of the semiconductor die is mounted to a sacrificial carrier. An encapsulant is deposited over the first thermally conductive layer and sacrificial carrier. The encapsulant is planarized to expose the first thermally conductive layer. A first insulating layer is formed over the second surface of the semiconductor die and a first surface of the encapsulant. A portion of the first insulating layer over the second surface of the semiconductor die is removed. A second thermally conductive layer is formed over the second surface of the semiconductor die within the removed portion of the first insulating layer. An electrically conductive layer is formed within the insulating layer around the second thermally conductive layer. A heat sink can be mounted over the first thermally conductive layer.

25 Claims, 8 Drawing Sheets

(51) Int. Cl.

| | | |
|---|---|---|
| *H01L 23/31* | (2006.01) | |
| *H01L 23/36* | (2006.01) | |
| *H01L 23/367* | (2006.01) | |
| *H01L 23/538* | (2006.01) | |
| *H01L 23/00* | (2006.01) | |
| H01L 23/48 | (2006.01) | |
| H01L 23/498 | (2006.01) | |

(52) U.S. Cl.
CPC .......... *H01L21/565* (2013.01); *H01L 21/568* (2013.01); *H01L 23/3114* (2013.01); *H01L 23/3128* (2013.01); *H01L 23/36* (2013.01); *H01L 23/3677* (2013.01); *H01L 23/49827* (2013.01); *H01L 23/5389* (2013.01); *H01L 24/19* (2013.01); *H01L 24/97* (2013.01); *H01L 23/481* (2013.01); *H01L 23/49816* (2013.01); *H01L 2224/0401* (2013.01); *H01L 2224/04105* (2013.01); *H01L 2224/12105* (2013.01); *H01L 2224/20* (2013.01); *H01L 2224/32145* (2013.01); *H01L 2224/73267* (2013.01); *H01L 2225/06517* (2013.01); *H01L 2225/06524* (2013.01); *H01L 2225/06541* (2013.01); *H01L 2225/06589* (2013.01); *H01L 2924/0103* (2013.01); *H01L 2924/014* (2013.01); *H01L 2924/01004* (2013.01); *H01L 2924/01005* (2013.01); *H01L 2924/01006* (2013.01); *H01L 2924/01013* (2013.01); *H01L 2924/01019* (2013.01); *H01L 2924/01029* (2013.01); *H01L 2924/01047* (2013.01); *H01L 2924/01073* (2013.01); *H01L 2924/01074* (2013.01); *H01L 2924/01079* (2013.01); *H01L 2924/01082* (2013.01); *H01L 2924/01322* (2013.01); *H01L 2924/09701* (2013.01); *H01L 2924/12041* (2013.01); *H01L 2924/12042* (2013.01); *H01L 2924/1306* (2013.01); *H01L 2924/13091* (2013.01); *H01L 2924/14* (2013.01); *H01L 2924/1433* (2013.01); *H01L 2924/15311* (2013.01); *H01L 2924/181* (2013.01); *H01L 2924/19041* (2013.01); *H01L 2924/19042* (2013.01); *H01L 2924/19043* (2013.01); *H01L 2924/3025* (2013.01); *H01L 2924/30105* (2013.01)

(56) References Cited

U.S. PATENT DOCUMENTS

| | | |
|---|---|---|
| 5,311,060 A | 5/1994 | Rostoker et al. |
| 5,353,498 A | 10/1994 | Fillion et al. |
| 5,841,193 A | 11/1998 | Eichelberger |
| 6,342,434 B1 | 1/2002 | Miyamoto et al. |
| 6,750,082 B2 | 6/2004 | Briar et al. |
| 7,042,074 B2 | 5/2006 | Gobl et al. |
| 7,276,783 B2 | 10/2007 | Goller et al. |
| 7,364,944 B2 | 4/2008 | Huang et al. |
| 7,365,273 B2 | 4/2008 | Fairchild et al. |
| 7,417,313 B2 | 8/2008 | Appelt et al. |
| 7,446,402 B2 | 11/2008 | Hsu |
| 7,619,901 B2 | 11/2009 | Eichelberger et al. |
| 7,957,135 B2 | 6/2011 | Ohkouchi et al. |
| 8,857,769 B1 * | 10/2014 | Hogan .................. B61L 1/187 246/122 R |
| 2006/0103008 A1 | 5/2006 | Ong et al. |
| 2006/0278972 A1 | 12/2006 | Bauer et al. |
| 2008/0105966 A1 | 5/2008 | Beer et al. |
| 2010/0013102 A1 | 1/2010 | Tay et al. |
| 2010/0237477 A1 | 9/2010 | Pagaila et al. |

\* cited by examiner

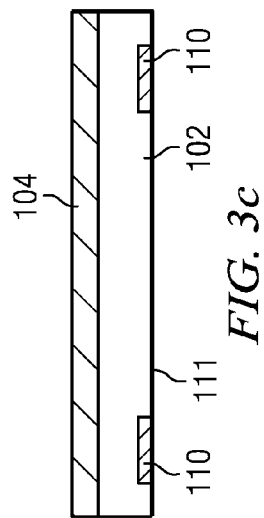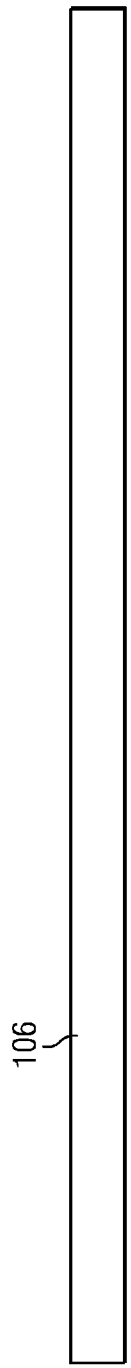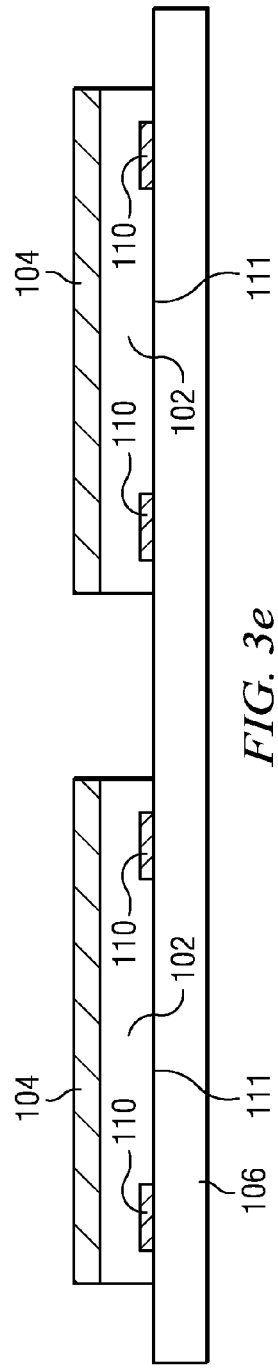

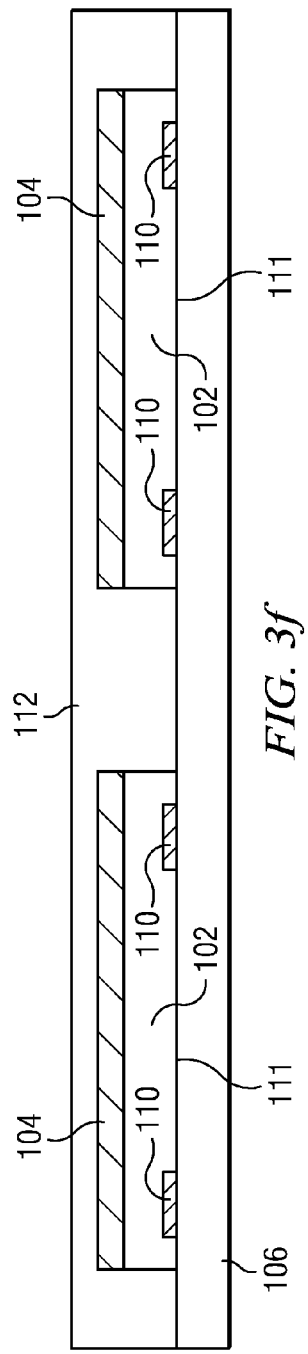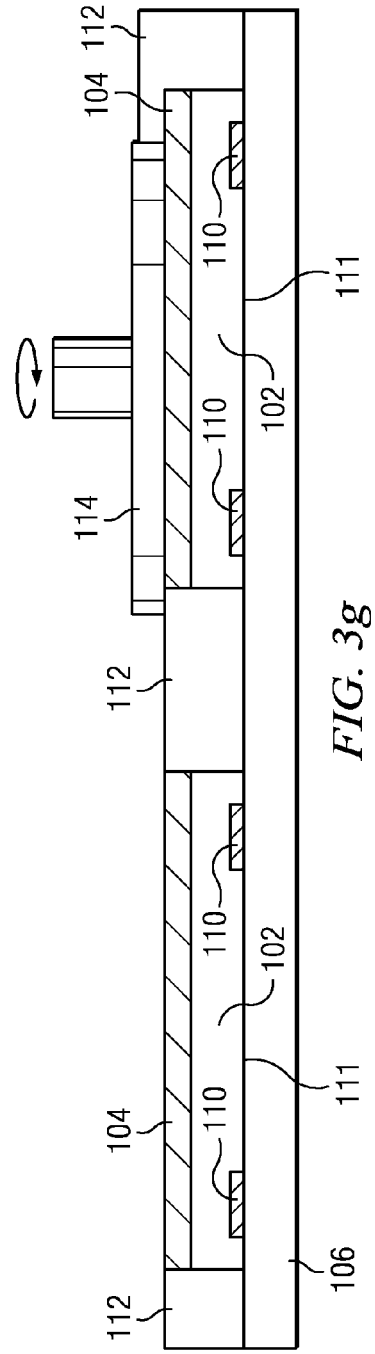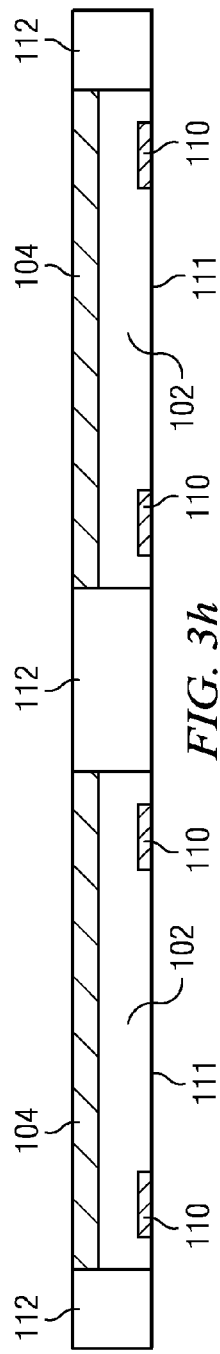

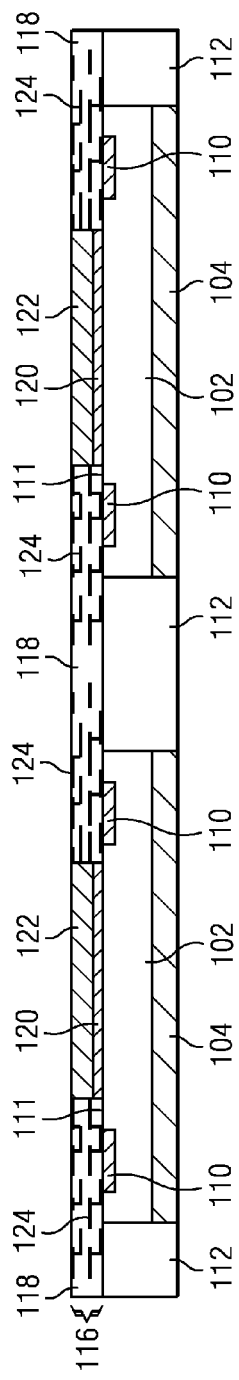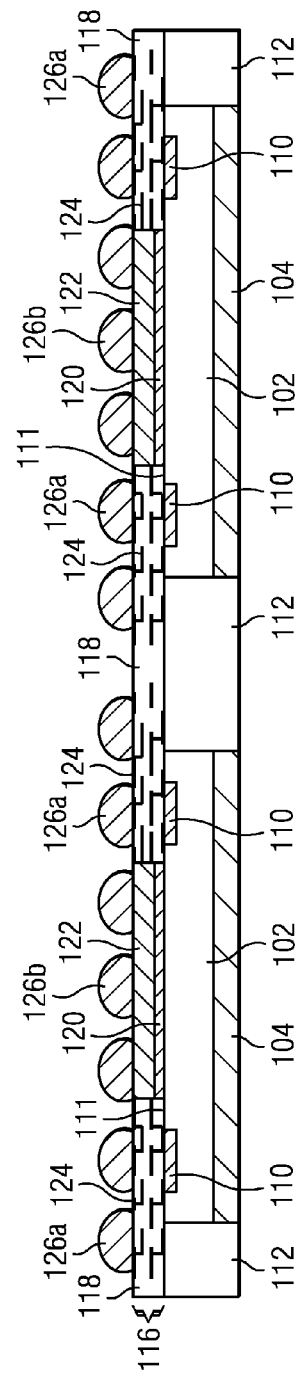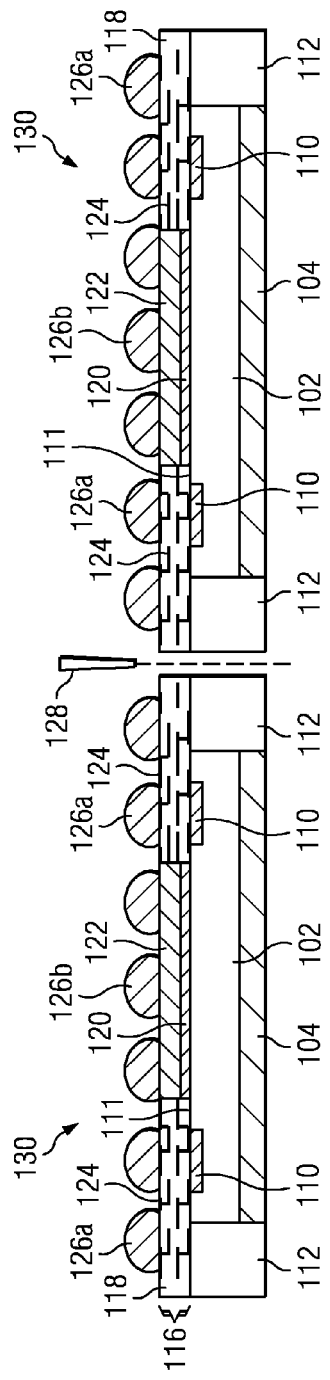

SEMICONDUCTOR DEVICE AND METHOD OF EMBEDDING THERMALLY CONDUCTIVE LAYER IN INTERCONNECT STRUCTURE FOR HEAT DISSIPATION

CLAIM TO DOMESTIC PRIORITY

The present application is a division of U.S. patent application Ser. No. 14/017,963, now U.S. Pat. No. 9,048,211, filed Sep. 4, 2013, which is a continuation of U.S. patent application Ser. No. 13/492,668, now U.S. Pat. No. 8,575,769, filed Jun. 8, 2012, which is a division of U.S. patent application Ser. No. 12/507,130, filed Jul. 22, 2009, now U.S. Pat. No. 8,237,252, which applications are incorporated herein by reference.

FIELD OF THE INVENTION

The present invention relates in general to semiconductor devices and, more particularly, to a semiconductor device and method of embedding a thermally conductive layer in the interconnect structure of the device for heat dissipation.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Another goal of semiconductor manufacturing is to produce higher performance semiconductor devices. An increase in device performance can be accomplished by forming active components that are capable of operating at higher speeds. In some high-performance semiconductor devices, a large number of digital circuits operate with a high frequency clock, e.g., a microprocessor operating in gigahertz range. In other high frequency applications, such as radio frequency (RF) wireless communications, integrated passive devices (IPDs) are often contained within the semiconductor device. Examples of IPDs include resistors, capacitors, and inductors. A typical RF system requires multiple IPDs in one or more semiconductor packages to perform the necessary electrical functions.

These high-performance semiconductor devices generate significant heat which must be adequately dissipated. Some semiconductor packages use the encapsulant or build-up interconnect structures to dissipate heat. However, encapsulant or build-up interconnect structures are typically poor thermal conductors. Without effective heat dissipation, the generated heat can reduce performance, decrease reliability, and reduce the useful lifetime of the semiconductor device. In addition, warpage due to differential thermal expansion coefficient between the semiconductor die and build-up interconnect structures can cause die stress and delamination.

SUMMARY OF THE INVENTION

A need exists to adequately dissipate heat in semiconductor devices. Accordingly, in one embodiment, the present invention is a semiconductor device comprising a first semiconductor die. A first thermally conductive layer is formed over the first semiconductor die. An interconnect structure is formed over the first semiconductor die. A first conductive via is formed through the first semiconductor die.

In another embodiment, the present invention is a semiconductor device comprising a first semiconductor die. A first thermally conductive layer is formed over the first semiconductor die. A first conductive via is formed through the first semiconductor die.

In another embodiment, the present invention is a semiconductor device comprising a first semiconductor die. A first thermally conductive layer is formed over the first semiconductor die. An encapsulant is deposited over the first semiconductor die and first thermally conductive layer.

In another embodiment, the present invention is a semiconductor device comprising a first semiconductor die. A first thermally conductive layer is formed over the first semiconductor die within a footprint of the first semiconductor die.

BRIEF DESCRIPTION OF THE DRAWINGS

FIGS. 3a-3k illustrate a process of forming thermally conductive layers over both sides of the semiconductor die;

DETAILED DESCRIPTION OF THE DRAWINGS

Figure 1:
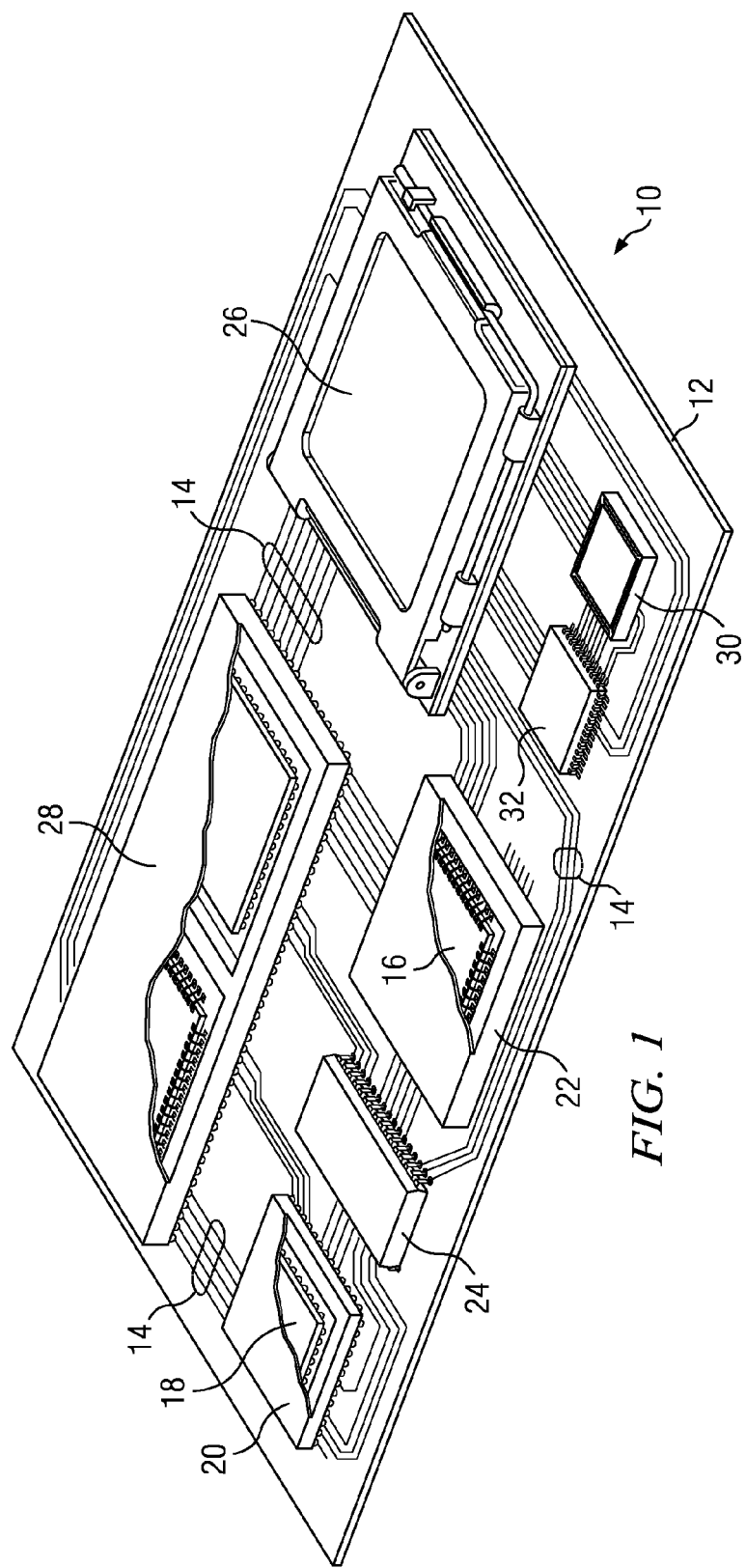
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 10 having a chip carrier substrate or printed circuit board (PCB) 12 with a plurality of semiconductor packages mounted on its surface. Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform one or more electrical functions. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components.

In FIG. 1, PCB 12 provides a general substrate for structural support and electrical interconnect of the semiconductor packages mounted on the PCB. Conductive signal traces 14 are formed over a surface or within layers of PCB 12 using evaporation, electrolytic plating, electroless plating, screen printing, or other suitable metal deposition process. Signal traces 14 provide for electrical communication between each of the semiconductor packages, mounted components, and other external system components. Traces 14 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 16 and flip chip 18, are shown on PCB 12. Additionally, several types of second level packaging, including ball grid array (BGA) 20, bump chip carrier (BCC) 22, dual in-line package (DIP) 24, land grid array (LGA) 26, multi-chip module (MCM) 28, quad flat non-leaded package (QFN) 30, and quad flat package 32, are shown mounted on PCB 12. Depending upon the system requirements, any combination of semiconductor packages, configured with any combination of first and second level packaging styles, as well as other electronic components, can be connected to PCB 12. In some embodiments, electronic device 10 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
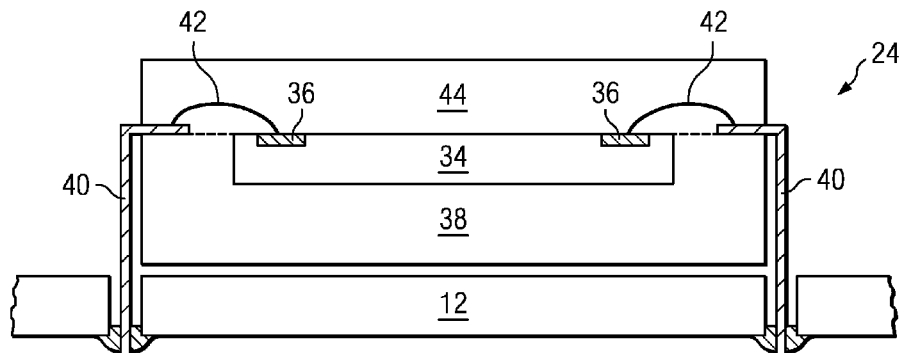
FIGS. 2a-2c illustrate further detail of the representative semiconductor packages mounted to the PCB.
Figure 2B:
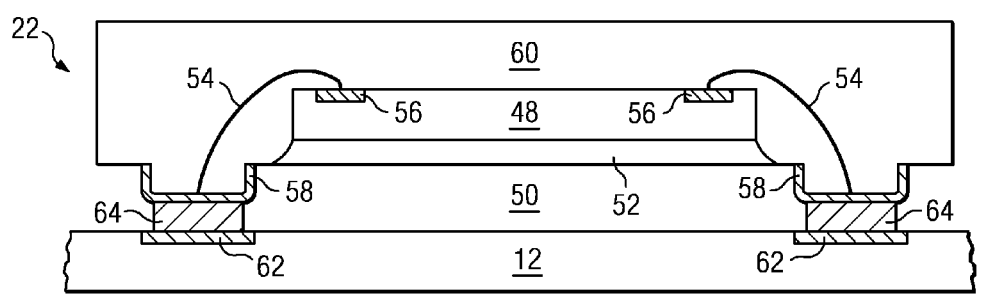
Figure 2C:
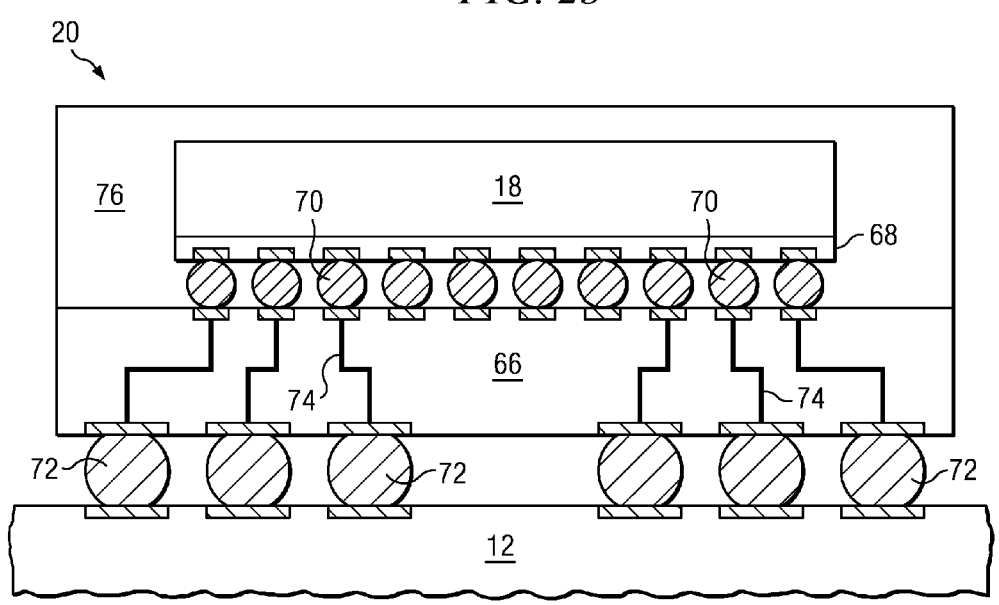

FIGS. 2a-2c show exemplary semiconductor packages. FIG. 2a illustrates further detail of DIP 24 mounted on PCB 12. Semiconductor die 34 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 34. Contact pads 36 are one or more layers of conductive material, such as aluminum (Al), copper (Cu), tin (Sn), nickel (Ni), gold (Au), or silver (Ag), and are electrically connected to the circuit elements formed within semiconductor die 34. During assembly of DIP 24, semiconductor die 34 is mounted to an intermediate carrier 38 using a gold-silicon eutectic layer or adhesive material such as thermal epoxy. The package body includes an insulative packaging material such as polymer or ceramic. Conductor leads 40 and wire bonds 42 provide electrical interconnect between semiconductor die 34 and PCB 12. Encapsulant 44 is deposited over the package for environmental protection by preventing moisture and particles from entering the package and contaminating die 34 or wire bonds 42.

FIG. 2b illustrates further detail of BCC 22 mounted on PCB 12. Semiconductor die 48 is mounted over carrier 50 using an underfill or epoxy-resin adhesive material 52. Wire bonds 54 provide first level packing interconnect between contact pads 56 and 58. Molding compound or encapsulant 60 is deposited over semiconductor die 48 and wire bonds 54 to provide physical support and electrical isolation for the device. Contact pads 62 are formed over a surface of PCB 12 using a suitable metal deposition such electrolytic plating or electroless plating to prevent oxidation. Contact pads 62 are electrically connected to one or more conductive signal traces 14 in PCB 12. Bumps 64 are formed between contact pads 58 of BCC 22 and contact pads 62 of PCB 12.

In FIG. 2c, semiconductor die 18 is mounted face down to intermediate carrier 66 with a flip chip style first level packaging. Active region 68 of semiconductor die 18 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 68. Semiconductor die 18 is electrically and mechanically connected to carrier 66 through bumps 70.

BGA 20 is electrically and mechanically connected to PCB 12 with a BGA style second level packaging using bumps 72. Semiconductor die 18 is electrically connected to conductive signal traces 14 in PCB 12 through bumps 70, signal lines 74, and bumps 72. A molding compound or encapsulant 76 is deposited over semiconductor die 18 and carrier 66 to provide physical support and electrical isolation for the device. The flip chip semiconductor device provides a short electrical conduction path from the active devices on semiconductor die 18 to conduction tracks on PCB 12 in order to reduce signal propagation distance, lower capacitance, and improve overall circuit performance. In another embodiment, the semiconductor die 18 can be mechanically and electrically connected directly to PCB 12 using flip chip style first level packaging without intermediate carrier 66.

Figure 3A:
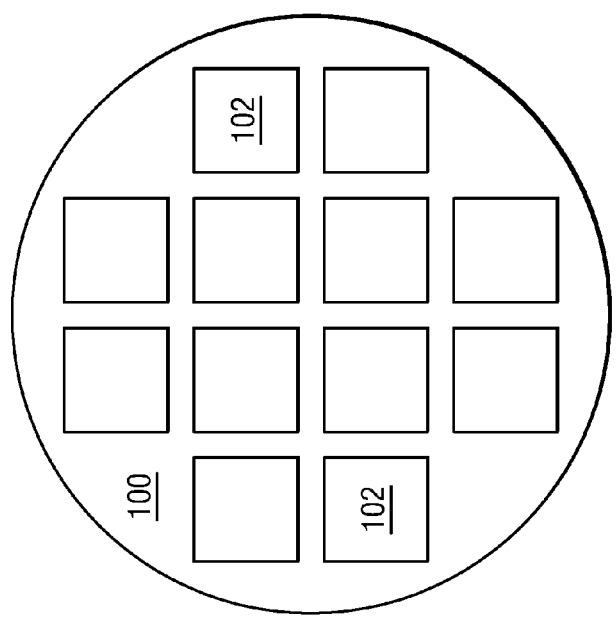

FIGS. 3a-3k illustrate a process of forming a fan-out wafer level chip scale package (FO-WLCSP) with thermally conductive layers formed over a backside of the die and within the interconnect structure for heat dissipation. FIG. 3a shows a semiconductor wafer 100 containing a plurality of semiconductor die 102 formed using the integrated circuit processes described above. Semiconductor die 102 each include a substrate with an active region containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within its active surface to implement baseband analog circuits or digital circuits, such as digital signal processor (DSP), memory, or other signal processing circuit.

Semiconductor die 102 may also contain integrated passive devices (IPD), such as inductors, capacitors, and resistors, for radio frequency (RF) signal processing. The IPDs provide electrical characteristics needed for high frequency applications, such as resonators, high-pass filters, low-pass filters, band-pass filters, symmetric Hi-Q resonant transformers, matching networks, and tuning capacitors. The IPDs can be used as front-end wireless RF components, which can be positioned between the antenna and transceiver. The IPD inductor can be a hi-Q balun, transformer, or coil, operating up to 100 Gigahertz. In some applications, multiple baluns are formed over a same substrate, allowing multi-band operation. For example, two or more baluns are used in a quad-band for mobile phones or other global system for mobile (GSM) communications, each balun dedicated for a frequency band of operation of the quad-band device. A typical RF system requires multiple IPDs and other high frequency circuits in one or more semiconductor packages to perform the necessary electrical functions.

Figure 3B:
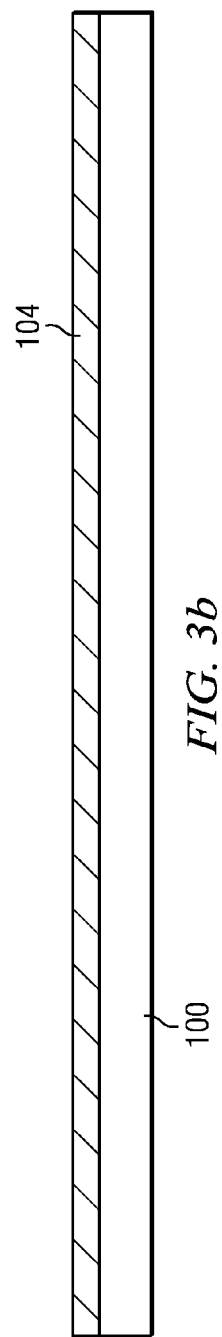

Semiconductor die 102 inherently generates heat during normal operation which must be properly dissipated. In FIG. 3b, a thermally conductive layer 104 is formed over a surface of semiconductor wafer 100 using a blanket deposition process, prior to singulation. Thermally conductive layer 104 can be Cu, Al, Au, Ag, or other material with thermal fillers such as alumina (Al2O3), zinc oxide (ZnO), Ag, or aluminum nitride (AlN). For example, thermally conductive layer 104 can be a thermal gel such as silicone with appropriate thermal filler. Thermally conductive layer 104 is characterized by a low coefficient of thermal expansion (CTE) (5-15 ppm/° C.) and high thermal conductivity ranging from 400-1400 W/m-K. After singulation, semiconductor 102 each have a thermally conductive layer 104 formed over a backside of the die, as shown in FIG. 3c.

In FIG. 3d, a sacrificial wafer-form substrate or carrier 106 contains dummy or sacrificial base material such as silicon, polymer, polymer composite, metal, ceramic, glass, glass epoxy, beryllium oxide, or other suitable low-cost, rigid material or bulk semiconductor material for structural support. An optional interface layer can be formed over carrier 106 as a temporary bonding film or etch-stop layer.

In FIG. 3e, semiconductor die 102, with thermally conductive layer 104 formed on its backside, are mounted over carrier 106 with contact pads 110 and active surface 111 oriented toward the carrier. In another embodiment, thermally conductive layer is formed over the backside of semiconductor die 102 after mounting to carrier 106. A discrete component can also be mounted over carrier 106.

FIG. 3f shows a molding compound or other suitable encapsulant 112 deposited over carrier 106 and semiconductor die 102 using a paste printing, compressive molding, transfer molding, liquid encapsulant molding, vacuum lamination, or other suitable applicator. Encapsulant 112 can be polymer composite material, such as epoxy resin with filler, epoxy acrylate with filler, or polymer with proper filler. Encapsulant 112 is non-conductive and environmentally protects the semiconductor device from external elements and contaminants.

A grinder 114 removes a portion of encapsulant 112 to create a planar surface and expose thermally conductive layer 104, as shown in FIG. 3g. Encapsulant 112 can be removed by chemical cleaning, chemical etching, mechanical peel-off, or CMP. Alternatively, the volume deposition of encapsulant 112 is controlled to a thickness that covers semiconductor die 102 while exposing thermally conductive layer 106.

In FIG. 3h, carrier 106 and optional interface layer are removed by chemical cleaning, chemical etching, mechanical peel-off, CMP, mechanical grinding, thermal bake, laser scanning, or wet stripping.

In FIG. 3i, the assembly is inverted and a bottom-side build-up interconnect structure 116 is formed over encapsulant 112 and active surface 111 of semiconductor die 102. The build-up interconnect structure 116 includes an insulating or dielectric layer 118 containing one or more layers of silicon dioxide (SiO2), silicon nitride (Si3N4), silicon oxynitride (SiON), tantalum pentoxide (Ta2O5), aluminum oxide (Al2O3), or other material having similar insulating properties. The insulating layers 118 are formed using PVD, CVD, printing, spin coating, spray coating, sintering with curing, or thermal oxidation.

A portion of insulating layer 118 is removed by an etching process to expose active surface 111 of semiconductor die 102. A thin dielectric layer 120 is formed over active surface 111 in the removed portion of insulating layer 118 to isolate active surface 111. Alternately, a thin layer of insulating material 118 remains over active surface 111 after the etching process to isolate active surface 111. A thermally conductive layer 122 is formed as one or more layers over dielectric layer 120 (or insulating layer 118) using a patterning and deposition process. Thermally conductive layer 122 can be Cu, Al, Ag, Au, or other material with thermal fillers such as Al2O3, ZnO, Ag, or AlN. For example, thermally conductive layer 122 can be a thermal gel such as silicone with appropriate thermal filler. Thermally conductive layer 122 is characterized by a low CTE (5-15 ppm/° C.) and high thermal conductivity ranging from 400-1400 W/m-K. Thermally conductive layer 122 covers a substantial area of semiconductor die 102. The large mass of thermally conductive layer reduces die warpage.

The build-up interconnect structure 116 further includes an electrically conductive layer 124 formed in insulating layer 118 around thermally conductive layer 122 using patterning with PVD, CVD, sputtering, electrolytic plating, electroless plating process, or other suitable metal deposition process. Conductive layer 124 can be one or more layers of Al, Cu, Sn, Ni, Au, Ag, or other suitable electrically conductive material. Conductive layer 124 can be formed simultaneously with thermally conductive layer 122. One portion of conductive layer 124 electrically connects to contact pads 110. Other portions of conductive layer 124 can be electrically common or electrically isolated depending on the design and function of semiconductor device 102.

In another embodiment, insulating layer 120 and thermally conductive layer 122 are formed over active surface 111 of semiconductor die 102 while in wafer form, i.e., prior to wafer singulation. In this case, build-up interconnect structure 116 is formed around thermally conductive layer 122, as shown in FIG. 3i.

In FIG. 3j, an electrically conductive bump material is deposited over conductive layer 124 and thermally conductive layer 122 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 124 and thermally conductive layer 122 using a suitable attachment or bonding process. In one embodiment, the bump material is reflowed by heating the material above its melting point to form spherical balls or bumps 126. Solder bumps 126a are formed on conductive layer 124 to route electrical signals through build-up interconnect structure 116 to contact pads 110 of semiconductor die 102. Solder bumps 126b are formed on thermally conductive layer 122 and operate as a thermal conductor to dissipate heat generated by semiconductor die 102. In some applications, bumps 126 are reflowed a second time to improve electrical contact to conductive layer 124 and thermally conductive layer 122. The bumps can also be compression bonded to conductive layer 124 and thermally conductive layer 122. Bumps 126 represent one type of interconnect structure that can be formed over conductive layer 124 and thermally conductive layer 122. The interconnect structure can also use bond wires, stud bump, micro bump, or other electrical interconnect.

Figure 4:
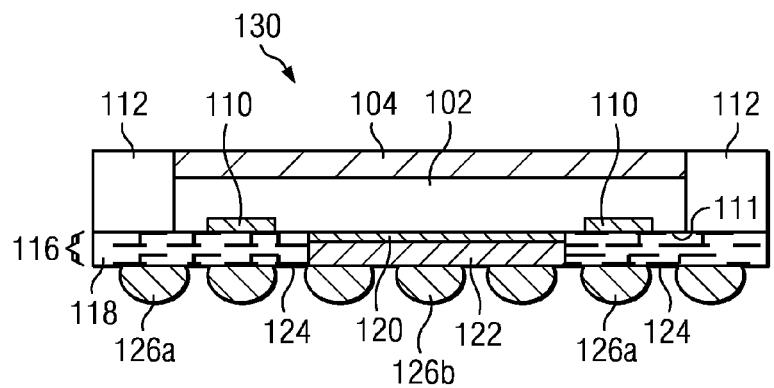
FIG. 4 illustrates the FO-WLCSP with thermally conductive layers formed over both sides of the die.
Figure 5:
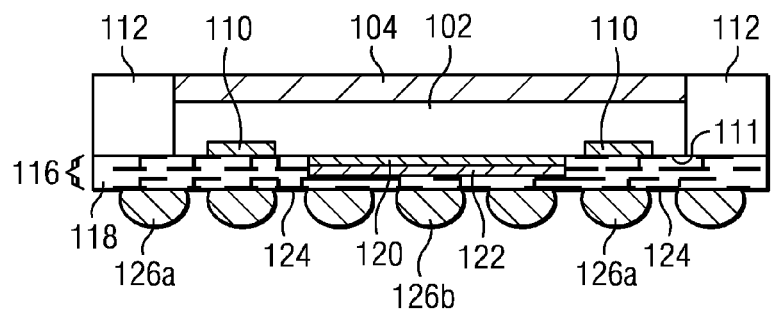
FIG. 5 illustrates the FO-WLCSP with the thermally conductive layer formed partially through the build-up interconnect structure.

Semiconductor die 102 are singulated with saw blade or laser cutting device 128 into individual semiconductor devices 130, as shown in FIG. 3k. FIG. 4 shows semiconductor package 130 after singulation. Thermally conductive layers 104 and 122 provide effective dual-side heat dissipation, which is particularly suitable for high performance semiconductor devices. Manufacturing costs are reduced by forming thermal conductive layer 104 at wafer level stage and by forming thermal conductive layer 122 simultaneously with build-up interconnect structure 116. Thermally conductive layers 104 and 122 also provide shielding against electromagnetic interference (EMI), radio frequency interference (RFI), and other inter-device interference. Thermally conductive layer 124 may extend through all layers of build-up interconnect structure 116, or partially through the interconnect structure, as shown in FIG. 5.

Figure 6:
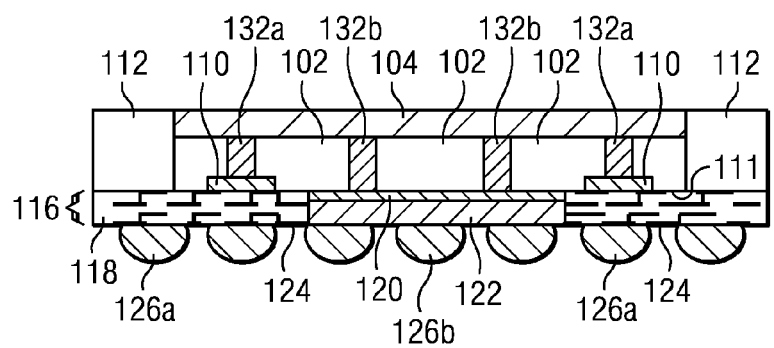
FIG. 6 illustrates the FO-WLCSP with the thermally conductive layers interconnected with TSVs.

FIG. 6 shows an embodiment with through silicon vias (TSV) 132 formed through semiconductor die 102 by etching or drilling a via through the silicon material and filling the via with Al, Cu, Sn, Ni, Au, Ag, titanium (Ti), W, poly-silicon, or other suitable electrically conductive material. TSVs 132a are formed between contact pads 110 and thermally conductive layer 104 and operate as a thermal conductor to dissipate heat generated by semiconductor die 102. TSVs 132b are formed between thermally conductive layers 104 and 122 and operate as a thermal conductor to dissipate heat generated by semiconductor die 102.

Figure 7:
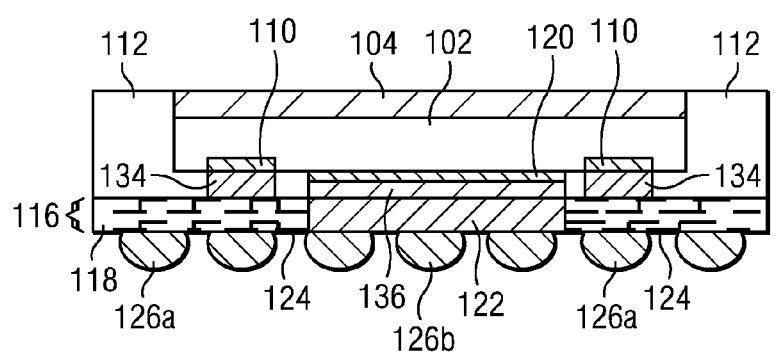
FIG. 7 illustrates the FO-WLCSP with an additional thermally conductive layer formed under the die.

FIG. 7 shows an embodiment with conductive bumps 134 formed between contact pads 110 of semiconductor die 102 and build-up interconnect structure 116. Conductive bumps 134 provide spacing to form an additional thermally conductive layer 136 between active surface 111 of semiconductor die 102 and thermally conductive layer 122. Thermally conductive layer 136 improves heat dissipation away from semiconductor die 102.

Figure 8:
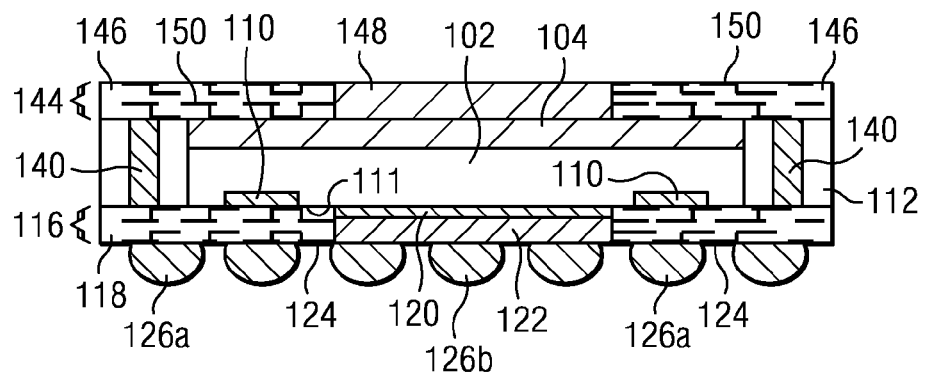
FIG. 8 illustrates the FO-WLCSP with topside build-up interconnect structure and thermally conductive layer.

In FIG. 8, conductive through hole vias 140 are formed by etching or drilling a via through encapsulant 112 and filling the via with Al, Cu, Sn, Ni, Au, Ag, titanium (Ti), W, poly-silicon, or other suitable electrically conductive material. A topside build-up interconnect structure 144 is formed over encapsulant 112 and thermally conductive layer 104. Conductive THVs 140 function as vertical (z-direction) interconnects extending from one side of encapsulant 112 to an opposite side of the encapsulant and electrically connect build-up interconnect structures 116 and 144. The build-up interconnect structure 144 includes an insulating or dielectric layer 146 containing one or more layers of SiO2, Si3N4, SiON, Ta2O5, Al2O3, or other material having similar insulating properties. The insulating layers 146 are formed using PVD, CVD, printing, spin coating, spray coating, sintering with curing, or thermal oxidation.

A portion of insulating layer 146 is removed by an etching process to expose thermally conductive layer 104. A thermally conductive layer 148 is formed as one or more layers over thermally conductive layer 104 using a patterning and deposition process. Thermally conductive layer 148 can be Cu, Al, Ag, Au, or other material with thermal fillers such as Al2O3, ZnO, Ag, or AlN. For example, thermally conductive layer 144 can be a thermal gel such as silicone with appropriate thermal filler. Thermally conductive layer 148 is characterized by a low CTE (5-15 ppm/° C.) and high thermal conductivity ranging from 400-1400 W/m-K.

The build-up interconnect structure 144 further includes an electrically conductive layer 150 formed in insulating layer 146 around thermally conductive layer 148 using patterning with PVD, CVD, sputtering, electrolytic plating, electroless plating process, or other suitable metal deposition process. Conductive layer 150 can be one or more layers of Al, Cu, Sn, Ni, Au, Ag, or other suitable electrically conductive material. Conductive layer 150 can be formed simultaneously with thermally conductive layer 148. One portion of conductive layer 150 electrically connects to conductive THVs 140. Other portions of conductive layer 150 can be electrically common or electrically isolated depending on the design and function of semiconductor device 102.

Figure 9:
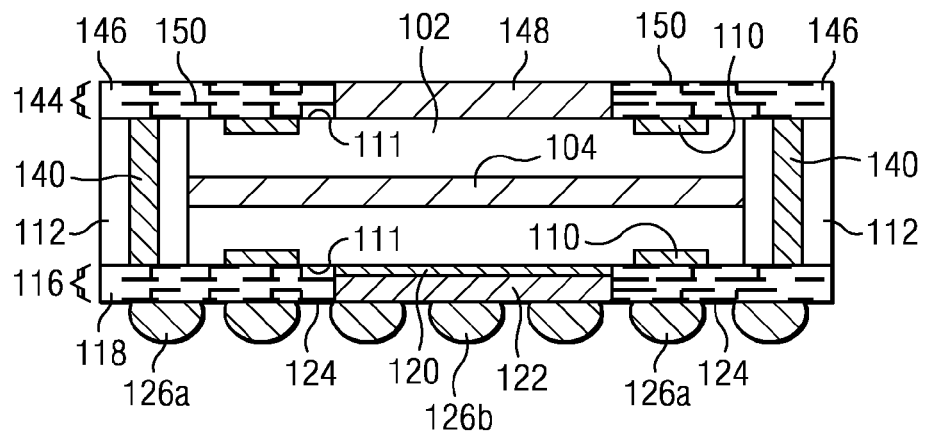
FIG. 9 illustrates back-to-back semiconductor die mated through the thermally conductive layers.

FIG. 9 shows an embodiment similar to FIG. 8 showing the additional feature that semiconductor die 102 are mounted back-to-back by mating thermally conductive layer 104 of each semiconductor die.

Figure 10:
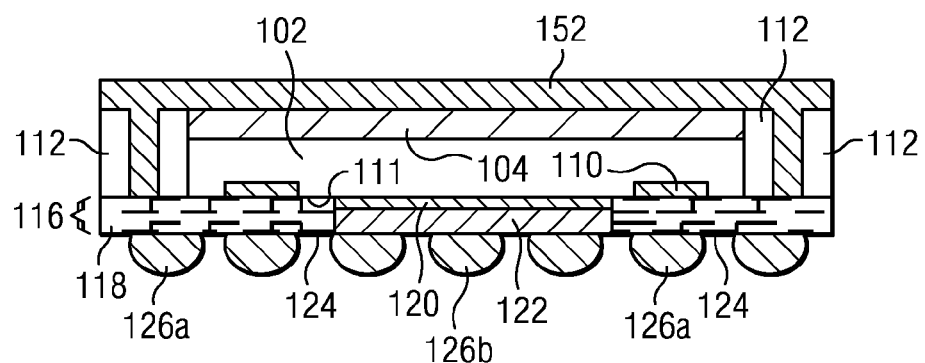
FIG. 10 illustrates the FO-WLCSP with a heat sink formed over the thermally conductive layer.

FIG. 10 shows an embodiment with heat sink 152 mounted over thermally conductive layer 104 and encapsulant 112. Heat sink 152 extends through encapsulant 112 to build-up interconnect structure 116. Heat sink 152 provides heat dissipation for the device.

While one or more embodiments of the present invention have been illustrated in detail, the skilled artisan will appreciate that modifications and adaptations to those embodiments may be made without departing from the scope of the present invention as set forth in the following claims.

What is claimed:
1. A semiconductor device, comprising:
a first semiconductor die;
a first thermally conductive layer formed over the first semiconductor die;
an interconnect structure formed over the first semiconductor die; and
a first conductive via formed through the first semiconductor die.
2. The semiconductor device of claim 1, further including an encapsulant deposited around the first semiconductor die.
3. The semiconductor device of claim 2, further including a second conductive via formed through the encapsulant.
4. The semiconductor device of claim 1, further including a second thermally conductive layer formed over the first semiconductor die opposite the first thermally conductive layer.
5. The semiconductor device of claim 1, further including a second semiconductor die disposed over the first thermally conductive layer opposite the first semiconductor die.
6. The semiconductor device of claim 1, further including a heat sink disposed over the first semiconductor die.
7. A semiconductor device, comprising:
a first semiconductor die;
a first thermally conductive layer formed over the first semiconductor die; and
a first conductive via formed through the first semiconductor die.
8. The semiconductor device of claim 7, further including an encapsulant deposited around the first semiconductor die.
9. The semiconductor device of claim 8, further including a second conductive via formed through the encapsulant.

10. The semiconductor device of claim 7, further including a second thermally conductive layer formed over the first semiconductor die opposite the first thermally conductive layer.

11. The semiconductor device of claim 7, further including an interconnect structure formed over the first semiconductor die opposite the first thermally conductive layer.

12. The semiconductor device of claim 7, further including a second semiconductor die disposed over the first thermally conductive layer opposite the first semiconductor die.

13. The semiconductor device of claim 7, further including a heat sink disposed over the first semiconductor die.

14. A semiconductor device, comprising:
   a first semiconductor die;
   a first thermally conductive layer formed over the first semiconductor die; and
   an encapsulant deposited over the first semiconductor die and first thermally conductive layer.

15. The semiconductor device of claim 14, further including an interconnect structure formed over the first semiconductor die opposite the first thermally conductive layer.

16. The semiconductor device of claim 14, further including a conductive via formed through the first semiconductor die.

17. The semiconductor device of claim 14, further including an interconnect structure formed over the first thermally conductive layer.

18. The semiconductor device of claim 14, further including a second semiconductor die disposed over the first thermally conductive layer opposite the first semiconductor die.

19. The semiconductor device of claim 14, further including a heat sink disposed over the first semiconductor die.

20. A semiconductor device, comprising:
   a first semiconductor die; and
   a first thermally conductive layer formed over the first semiconductor die within a footprint of the first semiconductor die.

21. The semiconductor device of claim 20, further including an encapsulant deposited around the first semiconductor die.

22. The semiconductor device of claim 21, further including a conductive via formed through the encapsulant.

23. The semiconductor device of claim 20, further including an interconnect structure formed over the first semiconductor die.

24. The semiconductor device of claim 20, further including a conductive via formed through the first semiconductor die.

25. The semiconductor device of claim 20, further including a second semiconductor die disposed over the first semiconductor die opposite the first thermally conductive layer.

* * * * *